United States Patent
Yoshikawa

(10) Patent No.: US 7,180,926 B2
(45) Date of Patent: Feb. 20, 2007

(54) SURFACE EMITTING SEMICONDUCTOR LASER

(75) Inventor: Masahiro Yoshikawa, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 226 days.

(21) Appl. No.: 10/629,777

(22) Filed: Jul. 30, 2003

(65) Prior Publication Data

US 2004/0114652 A1    Jun. 17, 2004

(30) Foreign Application Priority Data

Dec. 16, 2002    (JP)    ............ 2002-363484

(51) Int. Cl.
*H01S 5/00*    (2006.01)
(52) U.S. Cl. ............... 372/46.01; 372/45.01
(58) Field of Classification Search ............. 372/43, 372/44, 45, 46, 46.01, 45.01
See application file for complete search history.

(56) References Cited

U.S. PATENT DOCUMENTS 5,563,422 A * 10/1996 Nakamura et al. ............ 257/13
5,945,690 A * 8/1999 Saito et al. ................ 257/94
6,656,759 B1 * 12/2003 Nakanishi et al. ........... 438/39
2002/0110169 A1 * 8/2002 Iwai et al. ................. 372/43

FOREIGN PATENT DOCUMENTS

JP      A 10-154707         6/1998
JP      2002009393 A    *   1/2002

* cited by examiner

*Primary Examiner*—Minsun Oh Harvey
*Assistant Examiner*—Tod T. Van Roy
(74) *Attorney, Agent, or Firm*—Oliff & Berridge, PLC

(57) ABSTRACT

A surface emitting semiconductor laser is formed from a substrate having a first mirror formed thereon. The first mirror includes semiconductor layers of a first conductivity type. A second mirror is formed over the substrate and includes semiconductor layers of a second conductivity type. An active region is disposed between the first and second mirrors, with a current confining layer being disposed between the first and second mirrors. A compound semiconductor layer is formed over the second mirror and an electrode is formed on the compound semiconductor layer. A protective film covers the compound semiconductor layer and partially covers the electrode. The electrode is formed by a lift-off process and uses an opening-pattern that is formed by plasma ashing.

6 Claims, 10 Drawing Sheets

- 102 upper photoresist layer
- 101 lower photoresist layer
- 100 GaAs substrate

- 105 metal film
- 102
- 101
- 100

- 106 metal pattern
- 100

SURFACE EMITTING SEMICONDUCTOR LASER

BACKGROUND OF THE INVENTION

1. Field of the Invention

The present invention relates to a method of forming a conductive pattern such as electrodes on a compound semiconductor layer, and more particularly, to a method of forming a fine electrode pattern using a lift-off process.

2. Description of the Related Art

In a technical field of an optical communication and optical recording, the demand of using a surface emitting semiconductor laser (Vertical Cavity Surface Emitting Laser Diode) has been increased because of facilitation of the two-dimensional light source array. The surface emitting semiconductor laser device is typically made of compound semiconductor layers such as GaAs, AlGaAs and so on, and generally the lift-off process is employed to form electrodes and wirings with a predetermined shape and size.

For example, Japanese Laid-Open Patent Application No. 10-154707 discloses a lift-off process. As shown in FIGS. 10A to 10E, an upper photoresist layer 15 is formed on a lower photoresist layer 13 and the upper photoresist layer 15 is insolubilized after patterning of two photoresist layers. Then the lower photoresist layer 13 is dissolved to form an undercut for the upper photoresist layer 15n. After that, a conductive film (unshown) is formed by the lift-off process. By the formation of the undercut, the needed time for the lift-off process is shortened and the generation of flashes around the conductive layer is prevented.

However, there are following problems to be resolved in forming the pattern by the lift-off process as shown in the above application. When the electrodes and/or the metal wirings pattern are formed on the compound semiconductor layer such the surface emitting semiconductor laser device, the use of an alkali developer for forming the undercut in the lower resist layer causes the contact with the surface of the compound semiconductor layers and causes them to be etched. The compound semiconductor layer, e.g. GaAs, has a surface that is chemically weak, and therefore the etching progressives clearly memorably and the life time of devices may be shortened by the surface damages caused by the etching and the performances may be affected by the damages. Furthermore, when a p-side electrode which defines an emission window for the laser light is formed the contact layer such GaAs in the surface emitting semiconductor laser, the etching of a contact layer has an adverse effect on the optical characteristics or properties of the laser light.

SUMMARY OF THE INVENTION

The present invention has been made in view of the above circumstances and provides a method of forming a conductive pattern of electrodes or wirings in which the surface damages on the compound semiconductor layer is prevented as far as possible.

Furthermore, the present invention provides a method of forming a conductive pattern in which a fine pattern of electrode or wirings can be formed on the compound semiconductor layer by means of the lift-off process.

Furthermore, the present invention provides a method of manufacturing the surface emitting semiconductor laser using the method of forming the conductive pattern.

Furthermore, the present invention provides a surface emitting semiconductor laser and its manufacturing method in which the harmful effects on the optical characteristics of laser light are inhibited and the life time of device is improved.

According to an aspect of the present invention, a method of forming a conductive pattern such as an electrode on a compound semiconductor layer has forming a first organic layer on the compound semiconductor layer, forming a second layer on the first organic layer, the second layer being resistant to a plasma ashing, forming a pattern including a first aperture in the second layer, forming a second aperture in the first organic layer by the plasma ashing of the first organic layer using a mask of the pattern including the first aperture to expose the compound semiconductor layer in the second aperture, depositing a conductive layer over a region including the compound semiconductor layer exposed in the second aperture and the second layer, forming the conductive pattern on the compound semiconductor layer by a lift-off process.

According to another aspect of the present invention, a method of forming a conductive pattern over a compound semiconductor layer has forming a first organic layer on the compound semiconductor layer, forming an inorganic layer on the first organic layer, forming a second organic layer on the inorganic layer, forming a first pattern including a first aperture in the second organic layer, forming a second pattern including a second aperture in the inorganic layer by etching the inorganic layer using a mask of the first pattern including the first aperture, forming a third aperture in the first organic layer by a plasma ashing of the first organic layer using a mask of the second pattern including the second aperture to expose the compound semiconductor layer in the third aperture, depositing a conductive film over a region including the compound semiconductor layer exposed in the third aperture and the second organic layer, and forming the conductive pattern on the compound semiconductor layer by a lift-off process.

According to another aspect of the present invention, a method of manufacturing a surface emitting semiconductor laser, the surface emitting semiconductor laser including a first semiconductor mirror layer of first conductivity type over a substrate, a current confining layer over the first semiconductor mirror layer, an active region over the first semiconductor mirror layer, a second semiconductor mirror layer of second conductivity type over the active region and a contact layer including a compound semiconductor layer over the second semiconductor mirror layer, the method has following steps; forming a first organic layer on the contact layer, forming a second layer on the first organic layer, the second layer being resistant to a plasma ashing, forming a pattern including a first aperture in the second layer, forming a second aperture in the first organic layer by the plasma ashing of the first organic layer using a mask of the pattern including the first aperture to expose the contact layer in the second aperture, depositing a conductive layer over a region including the contact layer exposed in the second aperture and the second layer, and forming a conductive pattern on the contact layer by a lift-off process.

According to another aspect of the present invention, a surface emitting semiconductor laser has a substrate, a first mirror formed over the substrate, the first mirror including semiconductor layers of first conductivity type, a second mirror formed over the substrate, the second mirror including semiconductor layers of a second conductivity type, a active region disposed between the first and second mirrors, a current confining layer disposed between the first and second mirrors, a compound semiconductor layer formed over the second mirror, and an electrode formed on the compound semiconductor layer. A surface roughness of the compound semiconductor layer in at least a peripheral portion of the electrode is not more than 5nm.

BRIEF DESCRIPTION OF THE DRAWINGS

Preferred embodiments of the present invention will be described in detail based on the following figures, wherein.

DESCRIPTION OF THE PREFERRED EMBODIMENTS

A description will now be given of a method of forming a conductive pattern according to an embodiment of the present invention. FIG. 1 shows the method of forming an electrode on a compound semiconductor layer according to the first embodiment of the present invention.

In FIG. 1, a photoresist is provided on a GaAs substrate 100. The thickness of the photoresist is approximately 1.0~2.0 µm, which forms a lower photoresist layer 101. Subsequently, the lower photoresist layer 101 is subjected to a baking process at an appropriate temperature, e.g. 130° C. By the baking process, the photoresist is insolubilized and the photoresist turns to be resistant to a developer.

Next, a photoresist which is resistant to an oxygen plasma is formed on the lower photoresist layer 101. For example, the photoresist may be a photoresist containing silicon (FH-SP: production of Fuji Shashin Film Arch Co.). The thickness of the photoresist is approximately 1 µm, which forms an upper photoresist layer 102.

Figure 1A:
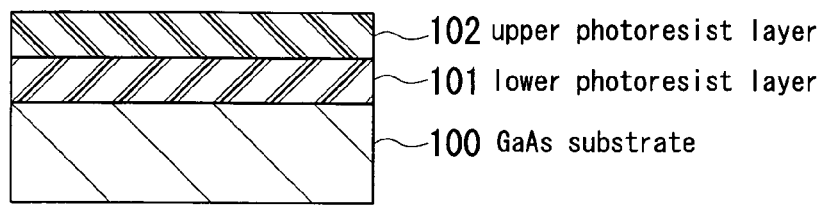
FIGS. 1A to 1E show steps for forming a metal pattern including electrode-like according to a first embodiment of the present invention.
Figure 1B:
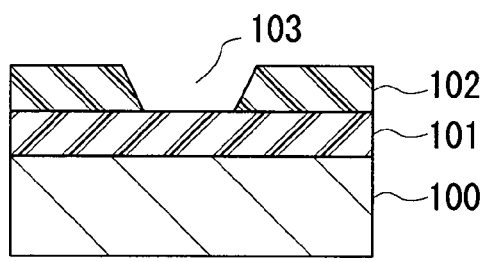

The upper photoresist layer 102 is subjected to a pre-baking process, for example 90 degree Celsius, and to an exposure process using a desirable mask pattern. Then the photoresist is developed by an alkali developer, as shown in FIG. 1B, a pattern including an aperture 103 (hereinafter referred to as aperture pattern) is formed in the upper photoresist layer 102.

Figure 1C:
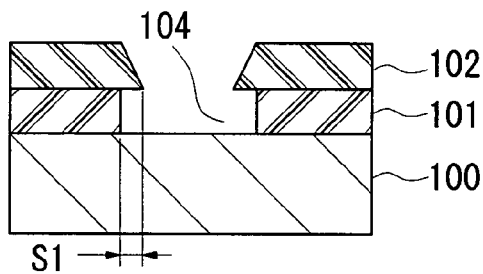

Subsequently, as shown in FIG. 1C, the exposed lower photoresist layer 101 is ashed by the oxygen plasma by the oxygen plasma etcher using a mask of the aperture pattern 103 of the upper photoresist layer 102, thereby the exposed region being removed. By selecting a suitable ashing time, an aperture pattern 104, which is similar to the aperture pattern 103 in the upper photoresist layer 102, is formed in the lower photoresist layer 101. Simultaneously, the upper photoresist layer 102 is not removed at all since it is resistant to the oxygen plasma. Also, the aperture pattern 104 formed in the lower photoresist 101 is removed laterally by the oxygen plasma ashing, which forms an undercut structure to the upper photoresist layer 102. The distance S1 of the undercut is approximately 1 µm.

Figure 1D:
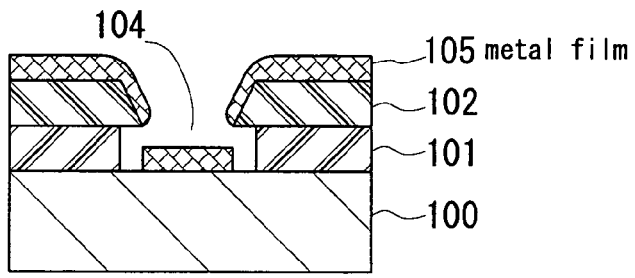

As shown in FIG. 1D, a metal film is deposited or vaporized over a region, which includes the upper photoresist layer 102 and the substrate exposed by the aperture pattern 104. The metal film 106 is preferably placed within the aperture pattern 104 because the aperture pattern 104 is made to the undercut structure to the upper photoresist layer 102.

Figure 1E:
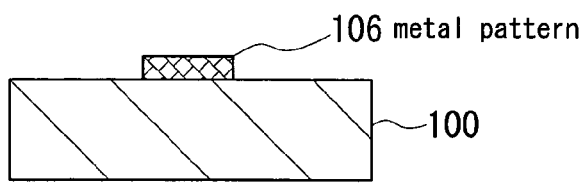

As shown in FIG. 1E, the lower photoresist layer 101 and the upper photoresist layer 102 are dissolved for removing, and a conductive pattern 106 such as an electrode and wiring pattern is formed on the surface of the substrate 100 by the lift-off process.

Figure 2A:
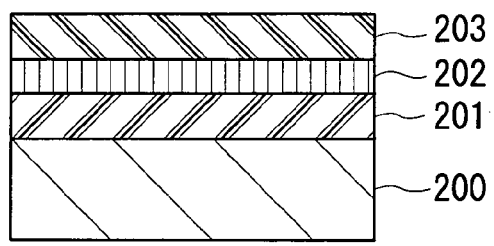
FIGS. 2A through 2F show a step for forming a metal pattern including electrode-like according to a second embodiment of the present invention.

Now the second embodiment of the present invention will be explained. FIG. 2 shows steps of forming an electrode of the second embodiment of the present invention. As shown in FIG. 2A, a photoresist is provided on a GaAs substrate 200 for forming a lower photoresist layer 201 with a thickness of approximately 1.0~2.0 µm. Then the lower photoresist 201 is baked at a desirable temperature. After that, an inorganic film 202, for example ITO, which is resistant to the oxygen plasma, is deposited on the entire surface with a thickness of approximately 1 µm. Additionally, a photoresist is coated on the inorganic film 202 to form an upper photoresist layer 203 with a thickness of approximately 1 µm, and then the upper photoresist layer 203 is subjected to the pre-baking process.

Figure 2B:
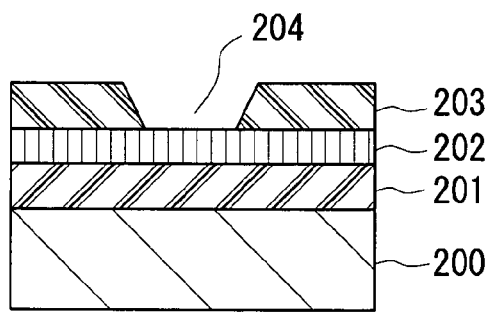

As shown in FIG. 2B, an aperture pattern 204 is formed after an exposure process made to the upper photoresist layer 203 using a desirable mask pattern. After that, a post baking process is done.

Figure 2C:
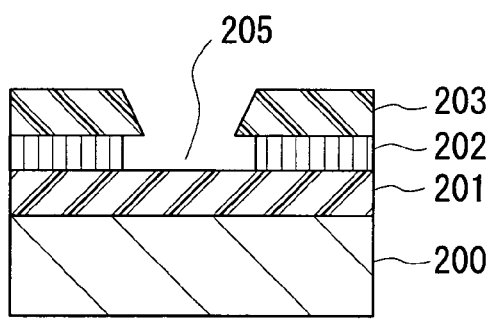
Figure 2D:
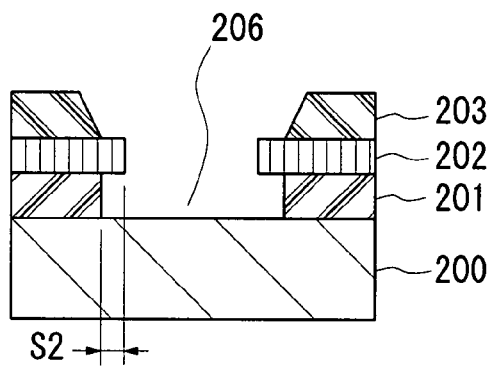

Next, as shown in FIG. 2C, the inorganic film 202 is etched by an etchant such as hydrochloric acid using a mask of the aperture pattern 204 of the upper photoresist layer 203. The region exposed by the upper photoresist layer 203 is removed off and an aperture pattern 205 is formed in the inorganic layer 202.

Subsequently, the lower photoresist layer 201 is subject to the ashing process of oxygen plasma by the oxygen plasma etcher using a mask of the aperture pattern 205 of the inorganic film 202. The inorganic film 202 is not etched off substantially because of being resistant to the oxygen plasma or oxygen radical. By performing the oxygen plasma ashing for a suitable time, an aperture pattern 206, which is similar to the aperture pattern 205 of the inorganic film 202, is formed in the lower photoresist layer 201, this resulting in a preferable undercut structure. In this embodiment, the lateral undercut distance S2 of the lower photoresist layer 201 is approximately 1 µm.

Figure 2E:
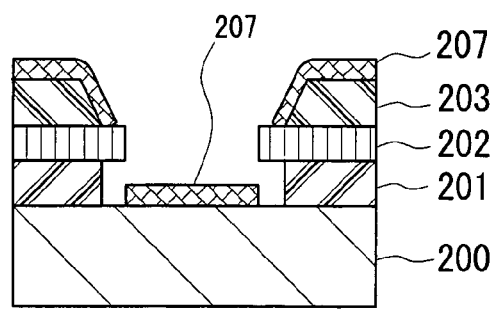
Figure 2F:
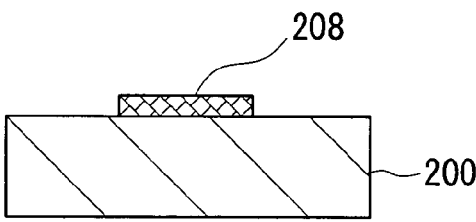

As shown in FIG. 2E, a metal film 207 is deposited on the entire surface of the substrate. The metal film 207, is placed on the upper photoresist layer 203 and on the substrate 200 exposed by the aperture 206 of the lower photoresist layer 201.

Finally, the photoresist layers and inorganic film are removed by the lift-off process for forming the metal pattern 208

As described above, by forming the metal pattern using the lift off process as shown in FIGS. 1 and 2, the surface of the substrate is not exposed and not etched by the developer and is kept flat so that the desirable metal wiring and/or electrode pattern can be formed. It is appreciated that a device having good characteristics can be fabricated.

Figure 3:
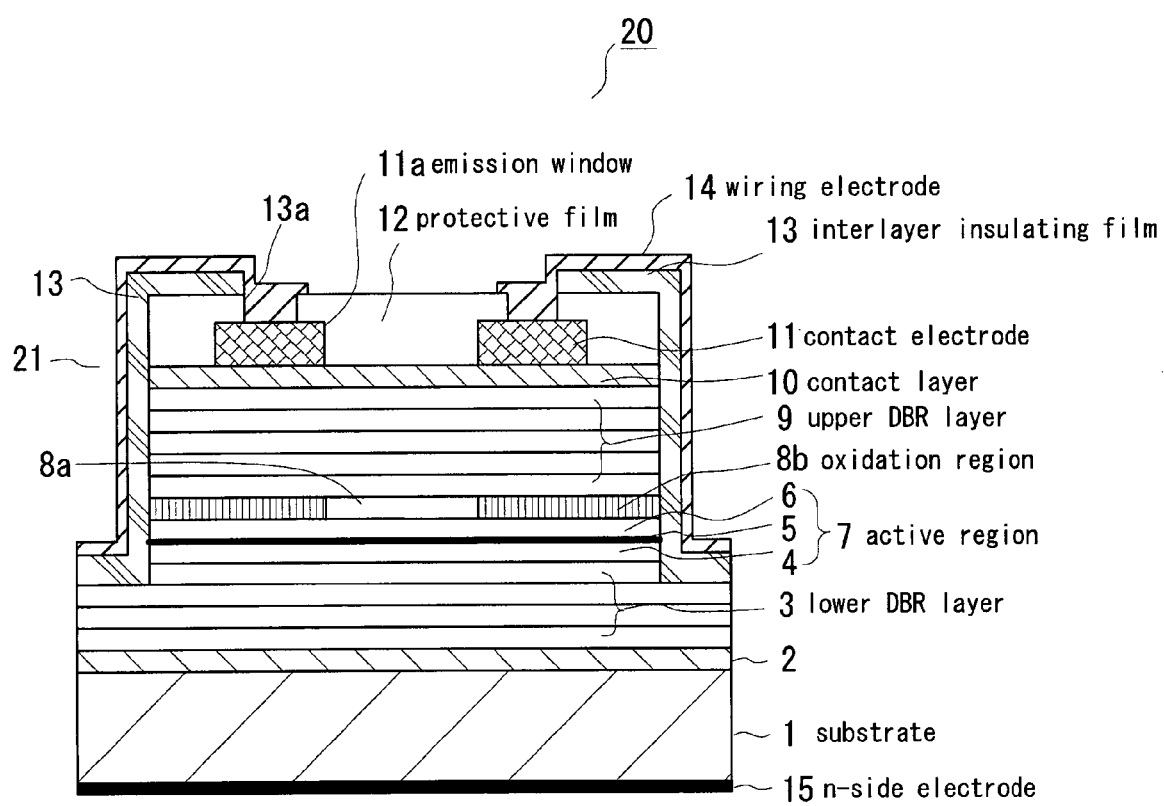
FIG. 3 shows a cross sectional view of the surface emitting semiconductor laser.

Now a method of manufacturing a surface emitting semiconductor laser which is applied by the above process in FIG. 1 will be explained. FIG. 3 shows a cross sectional view of the surface emitting semiconductor laser and FIGS. 4 to 9 show the steps for manufacturing it.

The surface emitting laser 20 of the embodiment is a type of selective oxidation surface emitting laser, which includes a laser element 20 of a cylindrical mesa structure (post structure or pillar structure). In the drawing, a protective film on the laser element 20 or mesa structure 21 and a bonding pad extended from a metal contact layer are omitted.

Referring to FIG. 4, 1 is a GaAs substrate of n type, 2 is a GaAs buffer layer of n type formed on the substrate 1. 3 is a lower DBR(Distributed Bragg Reflector) layer of n type. 7 is an active region formed on the lower DBR layer 3. The active region 7 is composed of laminated layers, which include an undoped lower spacer layer 4, undoped quantum well layer 5, and undoped upper spacer layer 6. 8 is a current confining layer formed on the active region 7. The current confining layer 8 includes an AlAs portion 8a which defines a circular aperture at the center and includes an oxidized region 8b around the AlAs portion 8a. The oxidized region 8b confines a current and light which pass through there. 9 is an upper DBR layer of p type formed on the current confining layer 8. 10 is a GaAs contact layer of p type formed on the upper DBR layer 10. 11 is a p-side contact electrode of annular-shape or ring-shape on the contact layer 10, which defines an emission window 11a for the laser light. 12 is a protective film for protecting the emission window 11a, formed on the contact electrode 11. 13 is an interlayer insulating film 13 which covers a top end, side and bottom of the mesa 21. 14 is a p-side wiring electrode, which is formed on the interlayer insulating film 13 and is connected to the contact electrode 11 though a contact hole 13a.

The emission window 11a is a circular shape and its center coincides with an optical axis which extends through a center of the mesa 21 and extends in a vertical direction with respect to the substrate 1. The center of AlAs portion 8a of the current confining layer 8 also coincides with the optical axis substantially. That is, the AlAs portion 8a and the emission window 11a are aligned mutually.

Figure 4A:
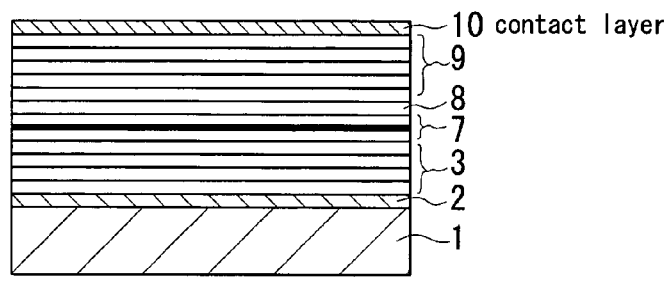
FIGS. 4A to 4C show steps for manufacturing the surface emitting semiconductor laser according to a third embodiment of the present invention.

Now the manufacturing method of the surface emitting semiconductor laser 20 will be explained. In FIG. 4A, semiconductor layers are formed on the substrate 1 by MOCVD (Metalorganic Chemical Vapor Deposition) or MBE (Molecular Beam Epitaxy). The GaAs buffer layer 2 of n type, the lower DBR layer 3, the active region 7 which includes the lower spacer layer 4 of undoped $Al_{0.6}Ga_{0.4}As$, a quantum well layer 5 having undoped GaAs well layer and having undoped $Al_{0.3}Ga_{0.7}As$ barrier layer and the upper spacer layer 6 of undoped $Al_{0.6}Ga_{0.4}As$, the upper DBR layer 9 and GaAa contact layer 10 of p type are sequentially laminated over the substrate 1.

The lower DBR layer 3 is laminated by 35.5 pairs or cycles of n-type $Al_{0.9}Ga_{0.1}As$ layer and n-type $Al_{0.3}Ga_{0.7}As$ layer alternately. Each layer is $\lambda/4\, n_r$ thick where $\lambda$ is oscillating wavelength and $n_r$ is refractive index of medium. The carrier concentration of the lower DBR layer 3 is $2\times10^{18}$ $cm^{-3}$ after silicon dopant is doped. While the upper DBR layer 9 is laminated by 23 cycles or pairs of p-type $Al_{0.9}Ga_{0.1}As$ and p-type $Al_{0.15}Ga_{0.85}As$ alternately. Each layer is $\lambda/4\, n_r$ thick where $\lambda$ is oscillating wavelength and $n_r$ is refractive index of medium. The carrier concentration of the upper DBR layer 9 is $2\times10^{18}$ $cm^{-3}$ after carbon dopant is doped.

A p-type AlAs layer 8, which is in place of P type $Al_{0.9}Ga_{0.1}As$ and is served as control layer, is interposed at the lowest layer within the upper DBR layer 9. The AlAs layer 8 is $\lambda/4\, n_r$ thick and its carrier concentration is $2\times10^{20}$ $cm^{-3}$ after carbon dopant is doped. A transition region which has a medium aluminum composition ratio may be interposed between $Al_{0.9}Ga_{0.1}As$ layer and $Al_{0.15}Ga_{0.85}As$ of the lower DBR layer 3 and upper DBR layer 9. The P type GaAs contact layer 10 is 20 nm thick and its carrier concentration is $1\times10^{18}$ $cm^{-3}$.

Figure 4B:
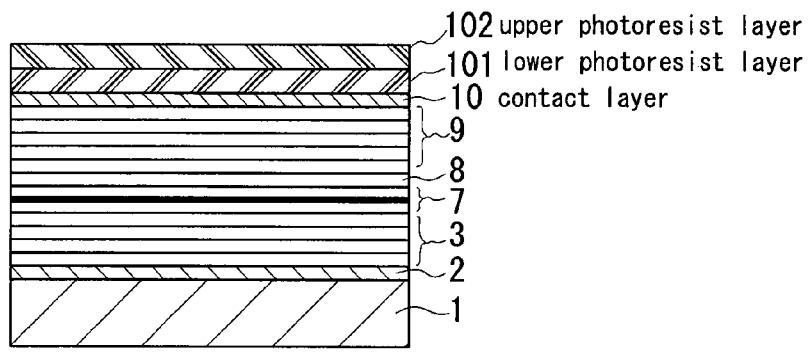

As shown in FIG. 4B, the lower photoresist layer 101 with thickness of 1.0 to 2.0 µm is formed on the contact layer 10 and it is baked at a desirable temperature, e.g. 130° C., which makes the lower photoresist layer 101 insolubilized.

Figure 4C:
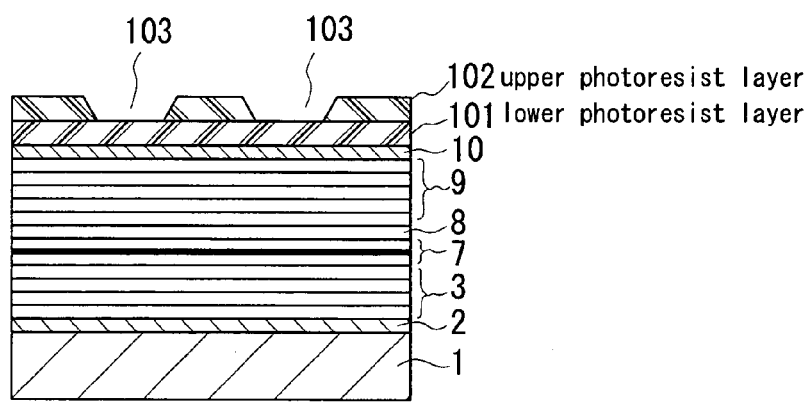

The upper photoresist 102 including silicon with an approximately 1 µm thickness is formed on the lower photoresist layer 101 and is pre-baked. After that, the upper photoresist layer 102 is subjected to the exposure process using a desired mask pattern and is patterned to form the aperture pattern 103 as shown in FIG. 4C using Alkali developer. Simultaneously, the lower photoresist 101 is not dissolved because it is insolubilized to the alkali developer. And then the post-bake is performed.

Figure 5D:
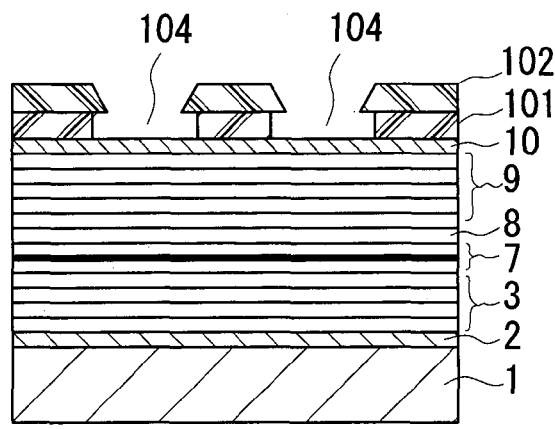
FIGS. 5D to 5F show steps for manufacturing the surface emitting semiconductor laser according to the third embodiment of the present invention.

As shown in FIG. 5D, the exposed lower photoresist layer 101 is ashed by the oxygen plasma by the oxygen plasma etcher using the mask of the pattern 103 of the upper photoresist layer 102 and the aperture pattern 104 which is in shape of an undercut is formed in the lower photoresist layer 101. The upper photoresist layer 102 is not removed at all since the resist including the silicon gives the property of resistant to the oxygen plasma.

Figure 5E:
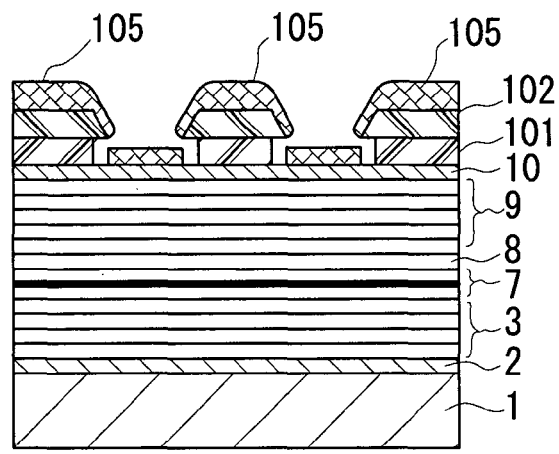

As shown in FIG. 5E, a metal film 105 is deposited over a region including the upper photoresist layer 102 and the contact layer 10 exposed by the aperture pattern 104. Since the second aperture pattern 104 is made to the undercut structure, the metal pattern 105 can be placed within the second aperture pattern 104.

Figure 5F:
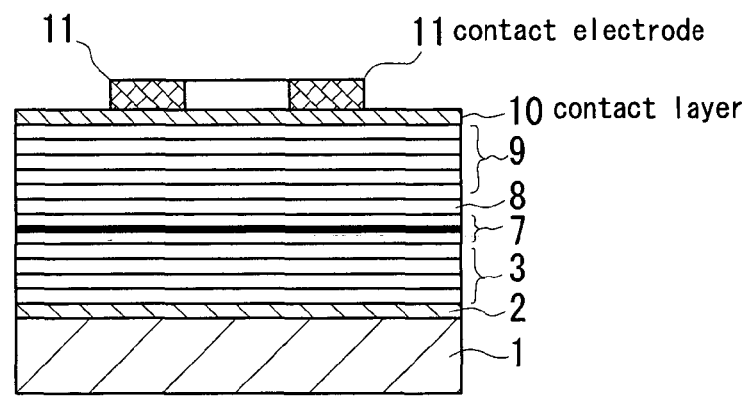

Subsequently, as shown in FIG. 5F, the lift-off process is done and the contact electrode 11 is formed on the surface of the contact layer 10. The electrode pattern 11 is inverted from the aperture pattern 104 and turns to p-side contact electrode 11. The p-side contact electrode 11 has a ring or annular shape and its inner diameter defines the emission window 11a for the laser light. For example, the material of the contact electrode 11 may be selected from at least one of Au, Pt, Ti, Ge, Zn, Ni, In, W and ITO.

Figure 6G:
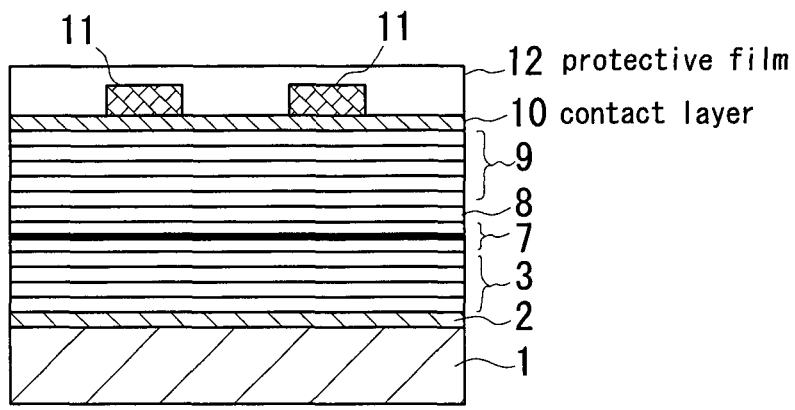
FIGS. 6G to 6I show steps for manufacturing the surface emitting semiconductor laser according to the third embodiment of the present invention.

Next, the protective film 12 is formed on the contact layer 10 including the p-side contact electrode 11 by PCVD (plasma-assisted chemical vapor deposition) as shown in FIG. 6G. For example, SiON, silicon oxide nitride, is deposited to a thickness of 250 nm.

Figure 6H:
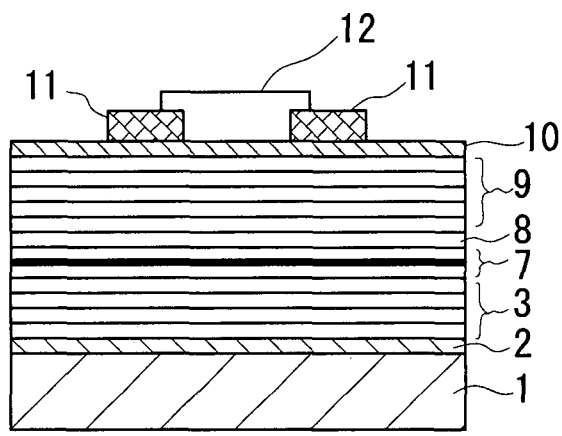

As shown in FIG. 6H, the protective film 12 where a photoresist pattern is not covered on is removed. The photoresist pattern is prepared by the photolithographic process. The patterned protective film 12 is thus formed on the contact electrode 11.

Figure 6I:
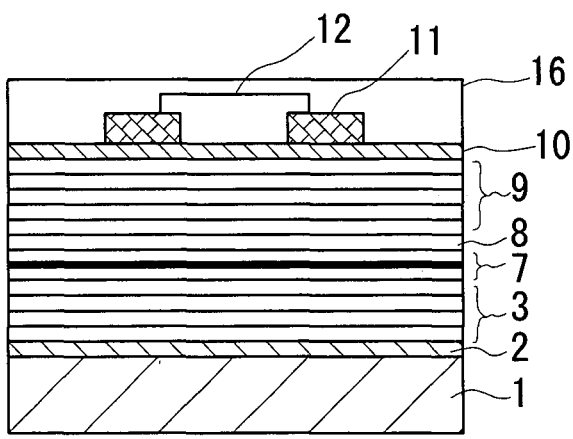

Next, as shown in FIG. 6I, a silicon nitride mask 16 is deposited to a thickness of 820 nm on the contact layer 10 including the contact electrode 11 and the protective film 12, for forming the mesa.

Figure 7J:
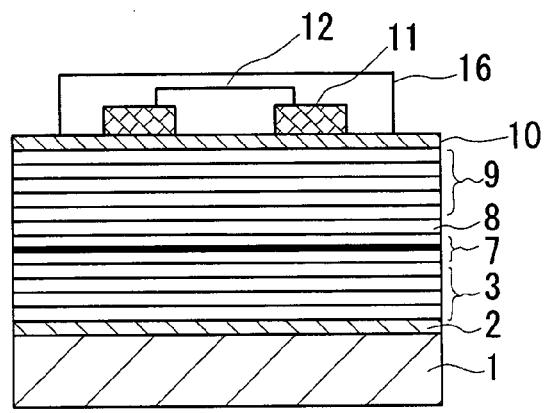
FIGS. 7J to 7L show steps for manufacturing the surface emitting semiconductor laser according to the third embodiment of the present invention.

As shown in FIG. 7J, by using a photoresist mask pattern prepared photolithographically, the mask 16 is patterned at predetermined size.

Figure 7K:
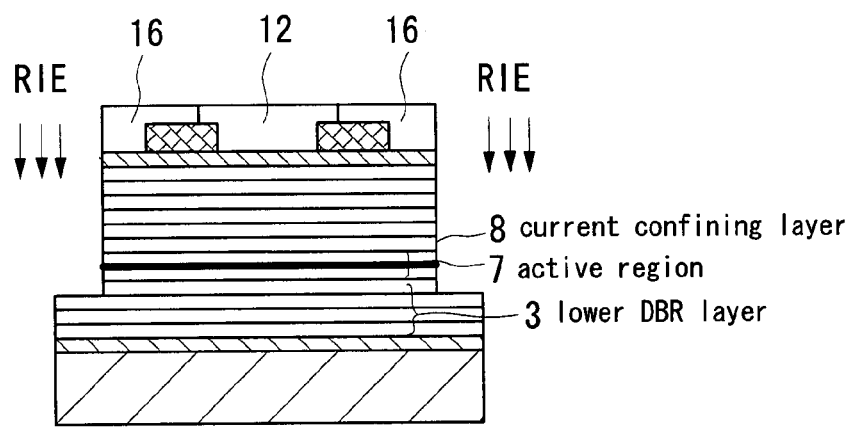

As shown in FIG. 7K, the semiconductor layers are etched using the mask 16 until a part of the lower DBR layer 3 is exposed and the mesa is formed. The etching is a reactive ion etching (RIE) using trichloride boron and chlorine.

Figure 7L:
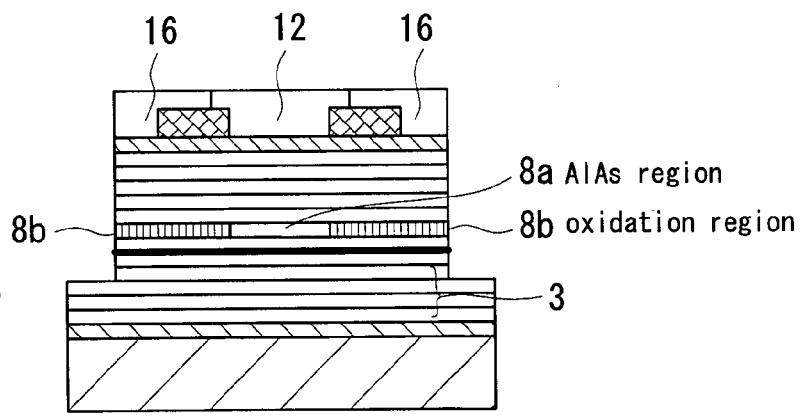

Next, as shown in FIG. 7L, using the wet type of oxidation furnace introducing water vapor, the AlAs layer 8 is exposed in water vapor and heated at 360 degree Celsius which causes the selective oxidation of the AlAs layer 8 from the sidewall of the mesa, and the oxidation region 8b is formed.

Figure 8M:
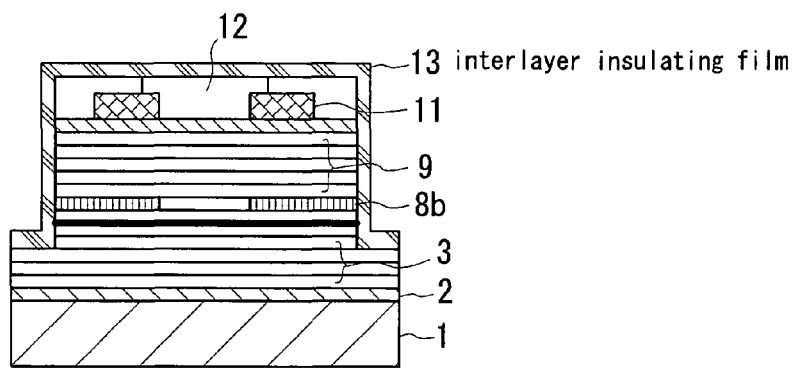
FIGS. 8M to 8O show steps for manufacturing the surface emitting semiconductor laser according to the third embodiment of the present invention.

Next, as shown in FIG. 8M, the interlayer insulating film 13 is formed on the mesa structure so as to cover the upper surface, side, and bottom thereof. The interlayer insulating film 13 is deposited to a thickness of 800 nm by PCVD.

Figure 8N:
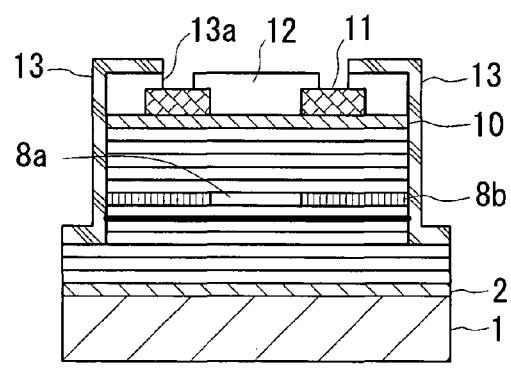

As shown in FIG. 8N, by using a photoresist mask pattern prepared by the photo lithograph, the interlayer insulating film 13 is subjected to the dry etching and the entire surface of the protective film 12 is exposed and a part of the mask 16 is removed. The etching gases are a mixture of SF6 and O2 which have a selectivity in etching. By this etching, the contact hole 13a is formed so as to expose a part of the p-side contact electrode 11. After that the photoresist mask pattern is removed.

Figure 8O:
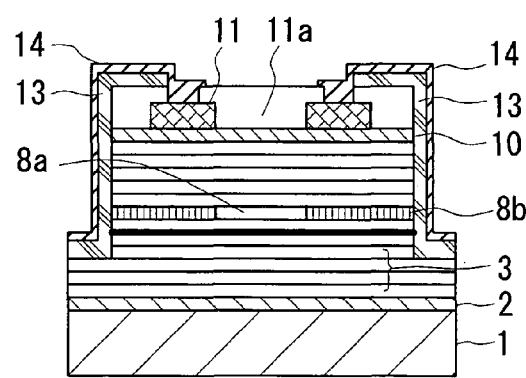

As shown in FIG. 8O, the wiring electrode 14 is patterned into a predetermined size and shape by the lift-off process after wiring materials, e.g., a laminate metal of Ti and Au, is deposited thereon. The center portion of the wiring electrode 14 on the upper face of the mesa is removed. The removed size may be larger than the emission window 11a defined by the contact electrode 11, and the wiring electrode 14 is contacted with the contact electrode 11 through the contact hole 13a.

Figure 9P:
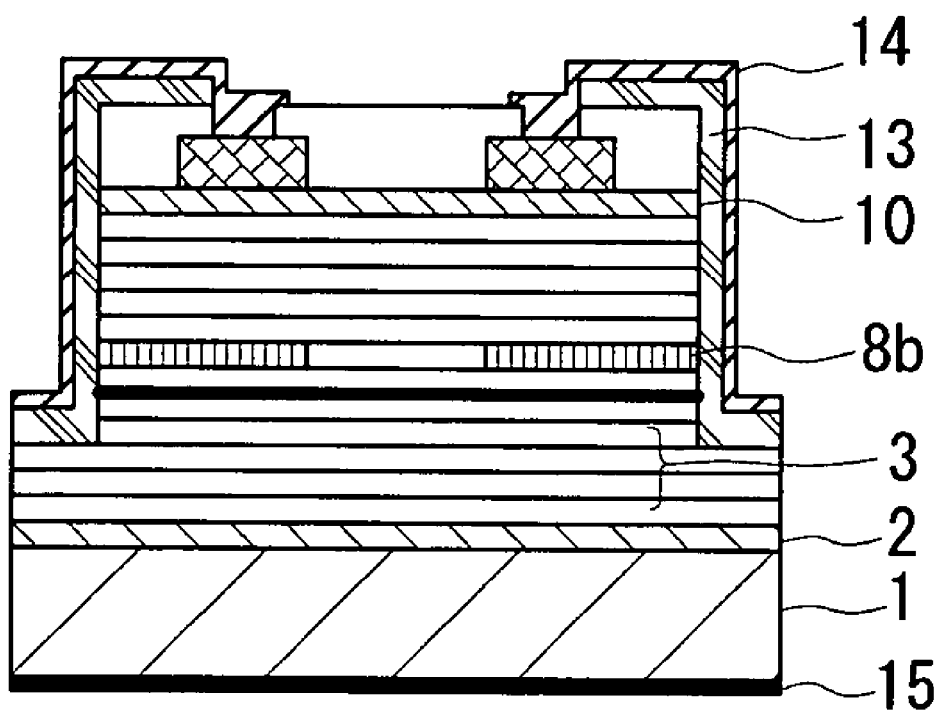
FIG. 9P shows steps for manufacturing the surface emitting semiconductor laser according to the third embodiment of the present invention.
Figure 10A:
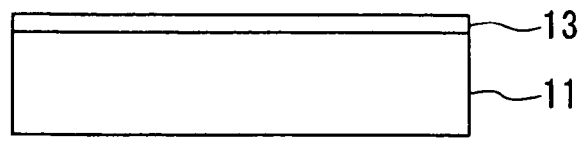
FIGS. 10A to 10E show steps for forming the conductive pattern including electrode-like in a prior art.
Figure 10B:
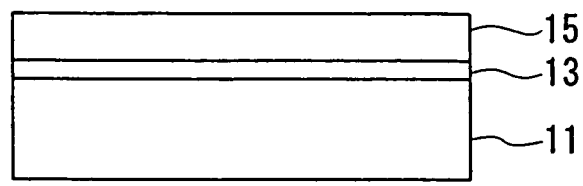
Figure 10C:
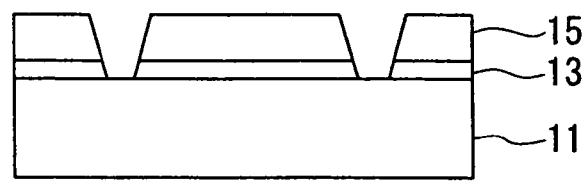
Figure 10D:
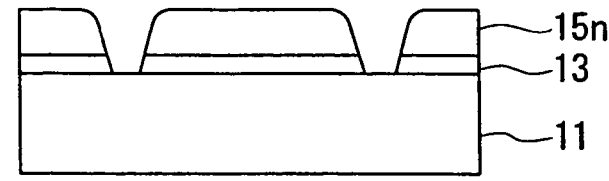
Figure 10E:
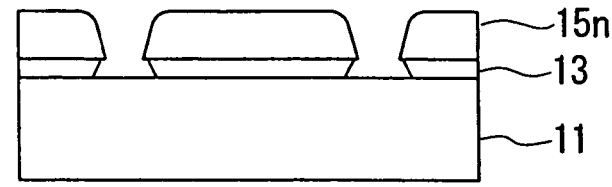

The n-type GaAs substrate 1 is then polished from the backside thereof until it reaches a thickness of 200 nm. As shown in FIG. 9P, materials for forming n-side electrode 15 are deposited on the backside of the n-type GaAs substrate 1. For example, a laminate of Au/Ge/Ni/Au may be used for the n-side electrode.

As explained above, it is possible to form the desired shape of the p-side contact electrode 11 on the contact layer 10 and to prevent the surface of the contact layer 10 at the contact electrode and its around from being etched by the developer. Thus, the damage of the emission window for the laser light can be reduced considerably, the characteristics of the laser light are stabilized and highly reliable surface emitting semiconductor laser can be obtained.

The preferable embodiment of the present invention is described above in detail, however, the present invention is not limited to the specifically disclosed embodiments, and other embodiments, variations and modifications may be made without departing from the scope of the present invention.

For example, the above embodiment shows the metal pattern that is formed over the GaAs substrate and GaAs semiconductor layers, however, other materials of compound semiconductor substrate and layers may be used. Other conductive materials for forming the electrodes may be used.

The above embodiment exemplifies the use of the oxygen plasma (oxygen radical) in the plasma ashing, however, other charged particles and the ultraviolet light may be added. Furthermore, although the above embodiment exemplifies two layered photoresist structure and two layered photoresist structure interposing the inorganic layer, another combination of layers which is resistant to and is not resistant to the plasma ashing may be used. Alternatively, another combination of layers which has a selectivity and non-selectivity in plasma ashing or etching may be used.

As explained the above, according to the present invention, the etching of the compound semiconductor layer by the developer described in the prior art can be prevented and the desirable conductive pattern can be formed on the compound semiconductor layer in maintaining a plane and clean surface of the compound semiconductor layer because the aperture pattern on the compound semiconductor layer is formed by the plasma ashing when the conductive pattern is formed on the compound semiconductor layer. By applying the process of the present invention with the manufacturing process of the surface emitting semiconductor laser using the compound semiconductor layers, it is possible to make the desirable pattern of the contact electrode on the compound semiconductor layers, consequently, the damage on the surface of the compound semiconductor layers can be reduced considerably and the operation of laser light is stabilized and the reliability can be improved.

Finally, the aforementioned description of the present invention is summarized as follows.

According to one aspect of the invention, a method of forming a conductive pattern such as an electrode on a compound semiconductor layer includes forming a first organic layer on the compound semiconductor layer, forming a second layer on the first organic layer, the second layer being resistant to a plasma ashing, forming a pattern including a first aperture in the second layer, forming a second aperture in the first organic layer by the plasma ashing of the first organic layer using a mask of the pattern including the first aperture to expose the compound semiconductor layer in the second aperture, depositing a conductive layer over a region including the compound semiconductor layer exposed in the second aperture and the second layer, and forming the conductive pattern on the compound semiconductor layer by a lift-off process.

According to this, the surface of the compound semiconductor layer is prevented from contacting with a solution such as an alkali developer-like, thus the surface etching is preferably inhibited and the surface damage by the etching can be reduces.

According to another aspect of the invention, a method of forming a conductive pattern over a compound semiconductor layer includes forming a first organic layer on the compound semiconductor layer, forming an inorganic layer on the first organic layer, forming a second organic layer on the inorganic layer, forming a first pattern including a first aperture in the second organic layer, forming a second pattern including a second aperture in the inorganic layer by etching the inorganic layer using a mask of the first pattern including the first aperture, forming a third aperture in the first organic layer by a plasma ashing of the first organic layer using a mask of the second pattern including the second aperture to expose the compound semiconductor layer in the third aperture, depositing a conductive film over a region including the compound semiconductor layer exposed in the third aperture and the second organic layer, and forming the conductive pattern on the compound semiconductor layer by a lift-off process.

According to this, the surface of the compound semiconductor layer is significantly prevented from the damages by the etching, which provides the desirable electrodes and/or wirings on the surface.

In a preferable first method, a photoresist is coated on a GaAs substrate (or GaAs layer) to form an lower resist layer of an organic layer. Then the lower photoresist is insolubilized to the developer after the baking process. Next, a photoresist which is resistant to an oxygen plasma is formed as a upper photoresist layer. The upper photoresist layer is patterned by a desirable mask pattern prepared by the photo lithographic process. Next, using an oxygen plasma either, the lower photoresist layer exposed by mask pattern of the upper photoresist layer is ashed by the oxygen plasma for patterning the lower photoresist layer. By executing the oxygen plasma ashing at desirable time, the pattern which is similar to the pattern of the upper photoresist layer is formed in the lower photoresist layer. After that, a conductive film such as a metal is deposited on an entire surface. Finally, the lower photoresist layer is subjected to the lift-off process to form electrodes and/or metal wirings on the substrate surface.

In a preferable second method, a photoresist is coated on a GaAs substrate (or GaAs layer) to form an lower resist layer as an organic layer. Next, the lower photoresist layer is solidified by the baking process-like and an inorganic layer which is resistant to the oxygen plasma is deposited on an entire surface. Additionally, a photoresist layer is coated to form an upper photoresist layer. After that, the upper photoresist layer is patterned using a desirable mask prepared by a photo lithograph process. Next, the inorganic layer is etched using the mask pattern of the upper photoresist layer. Next, the lower photoresist layer is ashed by the oxygen plasma using the mask pattern of the inorganic layer. By carrying out of the oxygen plasma process at a suitable time, a pattern which is same pattern or an undercut pattern of the upper photoresist layer is formed in the lower resist layer. Next, a conductive film such as metal-like is deposited on an entire surface. Finally, the lower photoresist layer is lifted off to make metal electrodes or metal wirings on the substrate surface.

Since the conductive pattern such as metal or wiring is formed on the surface of the compound semiconductor layer (including the substrate) such as GaAs by using the process according to the present invention, the surface of the compound semiconductor layer is inhibited from contacting with the alkali developer-like directly during the manufacturing processes. Consequently, the formation of metal wirings or electrodes can be realized without etching or damaging the substrate surface such as GaAs, whose surface is chemically weak.

The process according to the invention can be applied with a manufacturing method of the surface emitting semiconductor laser. The method of manufacturing a surface emitting semiconductor laser which included a first semiconductor mirror layer of first conductivity type over a substrate, a current confining layer over the first semiconductor mirror layer, an active region over the first semiconductor mirror layer, a second semiconductor mirror layer of second conductivity type over the active region and a contact layer including a compound semiconductor layer over the second semiconductor mirror layer, and the method includes forming a first organic layer on the contact layer, forming a second layer on the first organic layer, the second layer being resistant to a plasma ashing, forming a pattern including a first aperture in the second layer, forming a second aperture in the first organic layer by the plasma ashing of the first organic layer using a mask of the pattern including the first aperture to expose the contact layer in the second aperture, depositing a conductive layer over a region including the contact layer exposed in the second aperture and the second layer, and forming a conductive pattern on the contact layer by a lift-off process.

According to this, damages on the surface of the contact layers is significantly prevented and an occurrence of harmful effects on the output property of the laser light is prevented.

Preferably, the manufacturing method further includes a step of forming mesa structure which extends from at least the contact layer to the current confining layer and a step of selectively oxidizing a part of the current confining layer from the sidewall of the mesa structure. The manufacturing method can be applied with the surface emitting semiconductor laser having the mesa structure.

According to another aspect of the invention, a surface emitting semiconductor laser includes a substrate, a first mirror formed over the substrate, the first mirror including semiconductor layers of first conductivity type, a second mirror formed over the substrate, the second mirror including semiconductor layers of a second conductivity type, a active region disposed between the first and second mirrors, a current confining layer disposed between the first and second mirrors, a compound semiconductor layer formed over the second mirror, and an electrode formed on the compound semiconductor layer, wherein a surface roughness of the compound semiconductor layer in at least a peripheral portion of the electrode is not more than 5 nm.

The reason why the roughness is not more than 5 nm, the surface of the compound semiconductor layers is not etched by the solution such as alkali developer. In case the aperture or opening is formed in the photoresist layer using the alkali developer described as in the prior art, the surface of the compound semiconductor layer is etched, which generally causes depths over 5 nm. Consequently, the surface emitting semiconductor laser according to the invention makes the surface roughness to be planer than that of the prior art, which prevents the degradation or aggravation of the performances and optical properties of the surface emitting semiconductor laser.

Preferably, the compound semiconductor layer includes GaAs layer of the second conductivity type. Preferably, the metal electrode is formed by the lift-off process of the photoresist layers, which are patterned on the compound semiconductor layer by the plasma ashing.

What is claimed is:

1. A surface emitting semiconductor laser comprising:
   a substrate;
   a first mirror formed over the substrate, the first mirror including semiconductor layers of first conductivity type;
   a second mirror formed over the substrate, the second mirror including semiconductor layers of a second conductivity type;
   an active region disposed between the first and second mirrors;
   a current confining layer disposed between the first and second mirrors;
   a compound semiconductor layer formed over the second mirror;
   an electrode formed on the compound semiconductor layer; and
   a protective film that covers the compound semiconductor layer and partially covers the electrode,
   wherein the electrode formed by a lift-off process utilizes an opening-pattern which is formed by plasma ashing, and surface roughness of the compound semiconductor layer after formation of the electrode is not more than 5 nm.

2. The surface emitting semiconductor laser as claimed in claim 1, wherein the compound semiconductor layer includes a GaAs layer of the second conductivity type, and the second mirror underlying the GaAs layer includes an AlGaAs layer.

3. The surface emitting semiconductor laser as claimed in claim 1, wherein the electrode is formed in a ring-shaped pattern on the compound semiconductor layer and wherein an inner diameter of the ring-shaped pattern defines an emission window for laser light.

4. The surface emitting semiconductor laser as claimed in claim 3, wherein the protective film covers the emission window.

5. The surface emitting semiconductor laser as claimed in claim 1, wherein the electrode is defined through the steps of:
   forming a first organic layer on the compound semiconductor layer;
   forming a second layer on the first organic layer, the second layer being resistant to plasma ashing;
   forming a pattern including a first aperture in the second layer;
   forming a second aperture in the first organic layer by plasma ashing of the first organic layer using a mask pattern including the first aperture to expose the compound semiconductor layer in the second aperture; and
   depositing a conductive layer over a region including the compound semiconductor layer exposed in the second aperture and the second layer;
   wherein forming the pattern in the second layer includes a lift-off process, and surface roughness of the compound semiconductor layer after formation of the electrode is not more than 5 nm.

6. The surface emitting semiconductor laser as claimed in claim 1, further comprising an insulation film, wherein the compound semiconductor layer is totally covered with the electrode, the protective film and the insulation film.

* * * * *